United States Patent

Matsuda et al.

[11] Patent Number: 5,856,017
[45] Date of Patent: *Jan. 5, 1999

[54] GAS BARRIER FILM

[75] Inventors: Shusei Matsuda; Kiyoshi Iseki; Yoshiharu Morihara; Toru Kotani; Toshiyuki Oya; Toshio Uno; Teizo Harima; Hideomi Kobe; Yozo Yamada, all of Ohtsu, Japan

[73] Assignee: Toyo Boseki Kabushiki Kaisha, Japan

[*] Notice: The term of this patent shall not extend beyond the expiration date of Pat. No. 5,725,958.

[21] Appl. No.: 896,879

[22] Filed: Jul. 18, 1997

Related U.S. Application Data

[62] Division of Ser. No. 597,553, Feb. 2, 1996, Pat. No. 5,725,958, which is a continuation of Ser. No. 977,341, Dec. 28, 1992, abandoned.

[30] Foreign Application Priority Data

Dec. 28, 1991 [JP] Japan .................. 3-359629
Jan. 13, 1992 [JP] Japan .................. 4-24578
Feb. 6, 1992 [JP] Japan .................. 4-56940

[51] Int. Cl.$^6$ ........................................ B32B 9/04
[52] U.S. Cl. ................... 428/446; 428/451; 428/475.5; 428/480; 428/482; 428/473.5; 428/458; 428/500; 428/522; 428/689; 428/702
[58] Field of Search .................... 428/446, 451, 428/689, 702, 411.1, 480, 482, 475.5, 500, 522, 473.5, 458

[56] References Cited

U.S. PATENT DOCUMENTS 5,725,958   3/1998   Matsuda .................. 428/446

*Primary Examiner*—Timothy M. Speer
*Attorney, Agent, or Firm*—Leydig, Voit & Mayer, Ltd.

[57] ABSTRACT

The present invention provides a gas barrier film including a plastic film and a thin film which is made of a composition containing an oxide as a main component and is formed on at least one surface of the plastic film. A specific gravity of the thin film is 55% or more and 100% or less of a specific gravity of the oxide in the form of a crystal generally present at room temperature and under atmospheric pressure. Thus, the invention provides a gas barrier film having an excellent gas barrier and retort properties and bending resistance; a gas barrier film suitably used in a wrapping material for dried food, liquid food or food containing liquids, frozen food and retort food; a gas barrier film that can be used in an electronic oven, can be sterilized by micro waves and can contain a free-oxygen absorber; a gas barrier film suitably used in a paper carton, a tube, a lid and the like; and a gas barrier film suitably used for cutting off gas for industrial use.

6 Claims, 1 Drawing Sheet

GAS BARRIER FILM

This is a divisional of application Ser. No. 08/597,553, filed Feb. 2, 1996, now U.S. Pat. No. 5,725,958 which was a continuation of Ser. No. 07/977,341, filed Dec. 28, 1992, now abandoned.

BACKGROUND OF THE INVENTION

1. Field of the Invention

The present invention relates to a film used in wrapping materials that is required to be airtight such as wrapping materials for food, medicine and electronic components, the wrapping materials having excellent gas barrier and retorting properties and bending resistance (gelbo characteristics).

2. Description of the Related Art

As a conventional gas barrier film, the following films are known: films comprising a plastic film coated with a vinylidene chloride copolymer or a copolymer of ethylene and vinyl alcohol; and films comprising a plastic film having a thin film of aluminum or an oxide (such as silicon oxide and aluminum oxide) laminated thereon.

However, the former films have an insufficient gas barrier property against vapor, oxygen and the like. Particularly, when such films are used at a high temperature, the gas barrier property is markedly low. Moreover, the films comprising the vinylidene chloride copolymer have a problem of affecting the environment since they generate chlorine gas when incinerated.

Among the latter films, those having a thin film of aluminum are economical and have an excellent gas barrier property. However, since the film is opaque, the contents therein can not be seen from the outside. Moreover, when the film is used for wrapping retort food, it can not be cooked in an electronic oven since micro waves do not penetrate the film.

U.S. Pat. No. 3,442,686 describes a transparent flexible gas barrier film comprising an inorganic thin film such as a film of silicon oxide and aluminum oxide evaporated on a surface of a synthetic resin film substrate and a film further comprising another resin film laminated on the gas barrier film.

Japanese Patent Publication No. 51-48511 discloses a gas barrier film comprising $Si_xO_y$ (for example, $SiO_2$) evaporated on a surface of a synthetic resin. When such a silicon oxide type film is used for wrapping, the contents therein can be seen from the outside since it is transparent. Such a film can be used in an electronic oven.

But the above described films have only an insufficient gas barrier property. Among such films, one having a particular composition, that is, one having a $SiO_y$ (wherein y=1.3 to 1.8) type thin film has a relatively excellent gas barrier property. However, it has a brownish color. In addition, the gas barrier property and the bending resistance of such a silicon oxide type film are still insufficient. "Having a bending resistance" means not losing a gas barrier property by bending a film in steps after forming a film. (for example, steps of laminating, printing and making bags) or by careless handling of the film. The bending resistance is evaluated by measuring the gas barrier property after the gelbo treatment.

Japanese Laid-Open Patent Publication No. 62-101428 discloses a gas barrier film comprising a thin film containing aluminum oxide as a main component. This film is completely transparent and chemically stable, and the material costs are small. However, the gas barrier property against oxygen and bending resistance are not sufficient. Moreover, the film requires careful handling because the thin film itself is brittle.

Japanese Laid-Open Patent Publication No. 2-194944 discloses an $Al_2O_3$—$SiO_2$ type film as a gas barrier film with a retort property. "Having a retort property" means having an excellent airtightness and flexibility even after a high temperature treatment. The retort property is evaluated, for example, by measuring the gas barrier property under a condition for producing retort food. The $Al_2O_3$—$SiO_2$ type film comprises an $Al_2O_3$ layer and a $SiO_2$ layer laminated successively on a plastic film. A large scale machinery is required for the production of such a film. The gas barrier property and bending resistance of such a film are not sufficient either.

Further, a gas barrier film comprising a layer made of a composite oxide (an oxide containing two or more kinds of metals) formed on a film substrate is known. For example, Japanese Laid-Open Patent Publication No. 1-176069 discloses an M—Si—O type gas barrier film, wherein M is at least one kind selected from the group consisting of Na, Mg, Al, K, Ca, Ti, Cr, Mn, Fe, Co, Ni, Cu, Zn, Mo, Ag, In, Sn, Sb and V. Japanese Laid-Open Patent Publication Nos. 61-297134 and 61-297137 disclose a MgO—$SiO_2$ type and a MgO—CaO type gas barrier films, respectively. However, none of these films has a sufficient gas barrier property, an excellent bending resistance and a retorting property.

The thin film formed on the plastic film must be as thin as possible in order to improve the bending resistance and, the contrary, the thin film must have a certain thickness (for example, 2000 angstroms) so as to improve the retort property. When a film comprising an aluminum oxide thin film laminated on a plastic film is used for wrapping retort food, a range of a preferable thickness of the film is particularly small. Moreover, the film used for wrapping retort food is required to be resistant against conditions of the various steps of production such as the heat sealing step, a printing step and the like when it is made into a bag.

As described above, a transparent gas barrier film with satisfactory gas barrier and retort properties and an excellent bending resistance has not been provided.

SUMMARY OF THE INVENTION

The gas barrier film of this invention comprises a plastic film and a thin film which is made of a composition containing an oxide as a main component and is formed on at least one surface of the plastic film. A specific gravity of the thin film is 55% or more and 100% or less of a specific gravity of the oxide in a form of a crystal generally present at room temperature and under atmospheric pressure.

In another aspect of the present invention, the gas barrier film comprises a plastic film and a thin film which is made of a composition containing a composite oxide as a main component and is formed on at least one surface of the plastic film. A specific gravity of the thin film is 55% or more and 100% or less of a specific gravity of the composite oxide.

Thus, the invention described herein makes possible the advantages of (1) providing a gas barrier film having an excellent gas barrier and retort properties and bending resistance; (2) providing a gas barrier film suitably used in a wrapping material for dried food, liquid food or food containing liquids, frozen food and retort food; (3) providing a gas barrier film that can be used in an electronic oven, and can be sterilized by micro waves; (4) providing a gas barrier film suitably used in a paper carton, a tube, a lid and the like, or in a bag in which a free-oxygen absorber functions effectively; and (5) providing a gas barrier film suitably used for cutting off gas for industrial use.

These and other advantages of the present invention will become apparent to those skilled in the art upon reading and understanding the following detailed description with reference to the accompanying figures.

DESCRIPTION OF THE PREFERRED EMBODIMENTS

Figure 1:
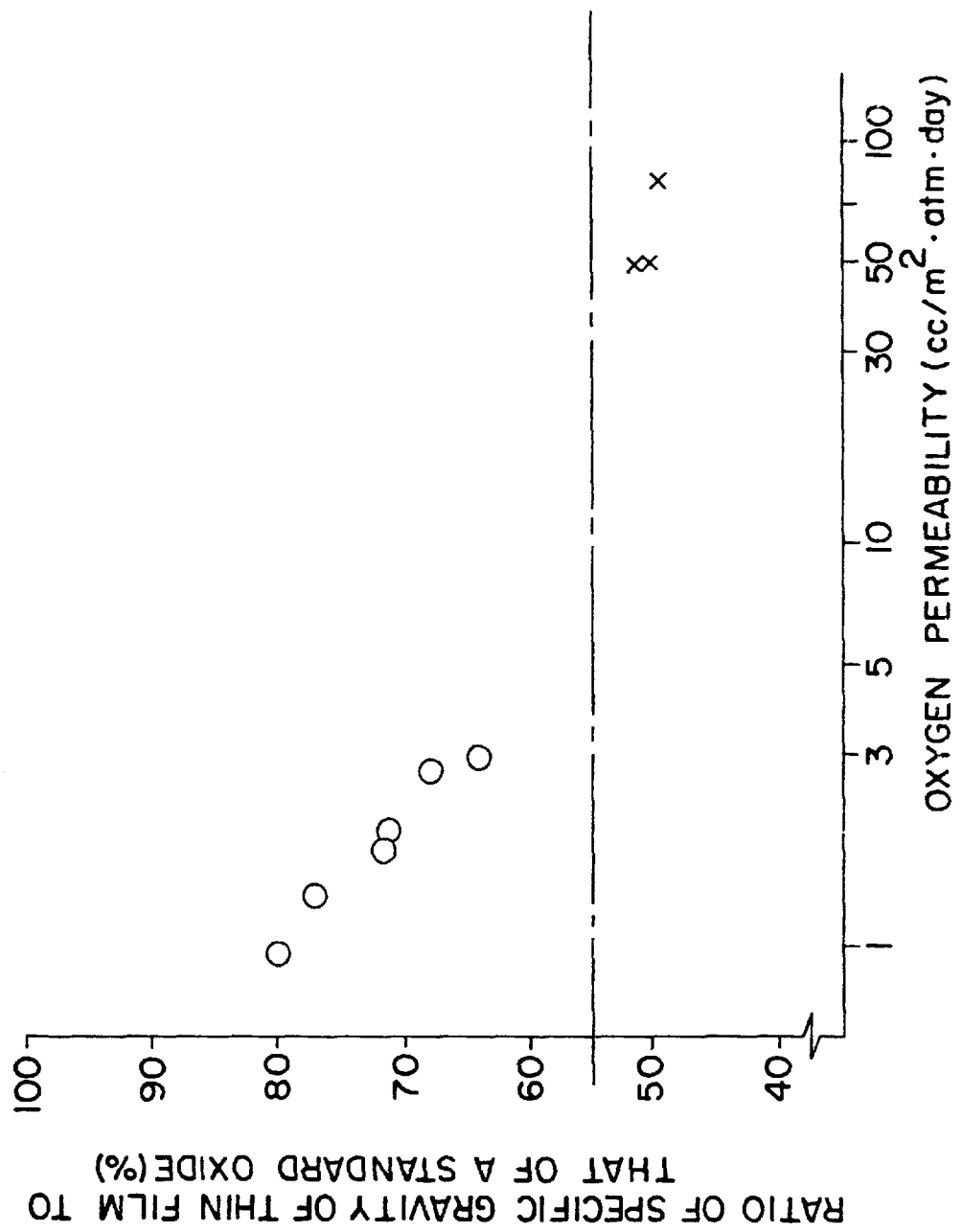
FIG. 1 is a graph showing results of Example 1 and Comparative Example 1 of the present invention, having a ratio of a specific gravity of a thin film to that of quartz as the axis of ordinates and an oxygen permeability of the thin film as the axis of abscissas.

The gas barrier film according to the present invention comprises a plastic film and a thin film formed on at least one surface of the plastic film. The plastic film is mainly made of an organic polymer. Examples of the organic polymer include polyethylene, polypropylene, polyethylene terephthalate, polyethylene-2,6-naphthalate, nylon 6, nylon 4, nylon 66, nylon 12, polyvinyl chloride, polyvinylidene chloride, polyvinyl alcohol, polyamide imide, polyimide, polyether imide, polysulfone, polyphenyl sulfide, polyphenylene oxide and any kind of aromatic polyamides. Such an organic polymer can be used singly, or a copolymer or a blend of two or more of them can be used.

A thickness of the plastic film is preferably 1 to 500 $\mu$m, and more preferably 5 to 300 $\mu$m.

Moreover, the plastic film can contain a known additive such as a UV absorber, an antistatic agent, a plasticizer, a lubricant and a coloring agent. When it is used as a transparent gas barrier film, a content of each of the additives must be adjusted so that the resultant film has a light permeability of 50% or more.

The thin film formed on at least one surface of the plastic film is made of a composition containing an oxide as a main component. The oxide herein means a compound of a metal, a non-metal or a semiconductor and oxygen, and includes a composite oxide. Examples of the oxide include silicon oxide, aluminum oxide, magnesium oxide, calcium oxide, boron oxide, zirconium oxide, titanium oxide, zinc oxide, strontium oxide and barium oxide. The composite oxide herein means a mixture of two or more of the above-mentioned oxides or an oxide containing two or more metal elements. Examples of the mixture of the oxides include a mixture of $Al_2O_3$ and $SiO_2$, a mixture of MgO and $SiO_2$, a mixture of $In_2O_3$ and $SnO_2$ and a mixture of $Al_2O_3$, MgO and $SiO_2$. Examples of the composite oxide include an oxide containing Al and Si, an oxide containing Mg and Si, and an oxide containing Al, Mg and Si.

When the thin film comprises a composition containing silicon oxide as a main component, the thin film comprises a composition which can contain various types of silicon oxides in which an extent of oxidation of such silicon oxides is not limited. Examples of the silicon oxide include SiO, $SiO_2$ and the like, and further include a silicon oxide which is less oxidized than SiO. A proportion of such components depends upon the production condition of the thin film. The composition can contain 10% or less of other components unless the characteristics of the thin film are spoiled.

When the thin film comprises a composition containing aluminum oxide as a main component, the thin film comprises a composition which can contain various types of aluminum oxides in which an extent of oxidation of such aluminum oxides is not limited. Examples of the aluminum oxide include AlO, $Al_2O_3$ and the like, and further include an aluminum oxide which is less oxidized than AlO. A proportion of such components depends upon a production condition of the thin film. The composition can contain 3% or less of other components unless the characteristics of the thin film are spoiled.

When the thin film comprises a composition containing aluminum oxide and silicon oxide as main components, the thin film comprises a composition containing a mixture of aluminum oxide and silicon oxide and the like; a composite oxide which contains Al and Si; or a mixture of aluminum oxide, silicon oxide and the composite oxide. Namely, the thin film comprises a composition which can contain aluminum oxides and/or silicon oxides oxidized to various extents. For example, the thin film comprises a composition containing at least one selected from SiO, $SiO_2$, Al, $Al_2O_3$, a composite oxide containing Al and Si. The composition can further include silicon oxides or aluminum oxides that are less oxidized than SiO or AlO. A proportion of each component also depends upon the production condition of the thin film. A proportion of aluminum oxide in the composition is 20% by weight or more and 99% by weight or less, preferably 30% by weight or more and 95% by weight or less. The composition can contain 3% or less of other components unless the characteristics of the thin film are largely varied.

When the thin film comprises a composition containing magnesium oxide and silicon oxide as main components, the thin film comprises a composition containing a mixture of magnesium oxide and silicon oxide and the like; a composite oxide which contains Mg and Si; or a mixture of magnesium oxide, silicon oxide and the composite oxide. For example, the thin film comprises a composition containing at least one selected from SiO, $SiO_2$, MgO, $MgO_2$, a composite oxide containing Mg and Si. The composition can further include silicon oxides or magnesium oxides that are less oxidized than SiO or MgO. A proportion of each component also depends upon the production condition of the thin film. A proportion of magnesium oxide in the composition is 3% by weight or more and 80% by weight or less, preferably 5% by weight or more and 70% by weight or less. The composition can contain 3% or less of other components unless the characteristics of the thin film are largely varied.

A specific gravity of the thin film is 55% or more and 100% or less of that of the corresponding naturally occurring oxide or the corresponding oxide having a crystal form generally present at room temperature under atmospheric pressure (hereinafter referred to as the "standard oxide").

A specific gravity herein means a ratio of a mass of a material with a certain volume at a certain temperature to a mass of a reference material (i.e., water at a temperature of 4° C.) with the same volume.

Some oxides have a plurality of crystal forms. The specific gravity of the standard oxide is herein taken as the specific gravity of that present at room temperature under atmospheric pressure. For example, the specific gravity of silicon oxide is taken as that of quartz, 2.65. The specific gravity of aluminum oxide is taken as that of $\alpha$-$Al_2O_3$, 3.97. The specific gravity of magnesium oxide is taken as 3.65, and that of calcium oxide is taken as 3.37.

Generally a specific gravity is measured by measuring a mass and a volume of a substance and calculating a ratio of the mass to that of water at a temperature of 4° C. with the same volume. But it is difficult to measure the specific gravity of the thin film in this invention because the thin film is laminated onto the plastic film. Therefore, preferably, the thin film is stripped off from the plastic film or the plastic film alone is melted at first. Then the specific gravity of the thin film is measured according to JIS K 7112. For example, in a sink and float test, a sample is sunk in a solution with a known specific gravity, and then the specific gravity of the sample can be determined from the setting and floating state thereof. As such a solution, a mixture of carbon tetrachloride and bromoform or methylene iodide can be used. Alternatively the specific gravity can be measured by a density gradient method in which a sample is sunk in a solution having a continuous density gradient.

The oxide thin film formed on a substrate film by evaporation generally has a lower density, i.e., a lower specific gravity than that of a naturally existing oxide. This is because (1) atoms of an atmospheric gas used in the evaporation step such as oxygen and nitrogen are incorporated into the film during the evaporation and (2) an atomic orientation of the thin film is disturbed because the thin film is formed by evaporation. A lower density, i.e., a lower specific gravity degrades the gas barrier property.

As described above, a ratio of the specific gravity of the thin film in the gas barrier film of the present invention to the specific gravity of the oxide or the composite oxide is higher than the conventional one and is 55% or more and 100% or less, preferably 60 to 95% and most preferably 63 to 90%. When the ratio is less than 55%, the thin film can not sufficiently cut off gas because the density of the oxide or the composite oxide is low, i.e., the thin film is coarse. A thin film having a high density of the oxide or the composite oxide therein, i.e., a fine thin film is required to provide a satisfactory gas barrier property. In other words, the thin film must have a large specific gravity. This means that a preferable thin film has a large ratio of the specific gravity of the thin film to that of the oxide or the composite oxide contained therein.

When the thin film comprises a composition containing silicon oxide as a main component, the specific gravity of the thin film is preferably 1.80 to 2.20 (i.e., 68 to 83% of the specific gravity of quartz), and more preferably 1.90 to 2.15. When the specific gravity of the thin film is less than 1.80, the structure of the thin film can be too coarse to provide a sufficient gas barrier property to the resultant film. When the specific gravity of the thin film is over 2.20, although the gas barrier property of the resultant film after forming the thin film is excellent, the mechanical property, especially the bending resistance of the resultant film is inferior and the gas barrier property is largely degraded after the gelbo treatment because the thin film is too rigid. Thus such a film is not suitable for use as a gas barrier film.

When the thin film comprises a composition containing aluminum oxide as a main component, the specific gravity of the thin film is preferably 2.70 to 3.30 (i.e., 68 to 83% of the specific gravity of α-aluminum oxide), and more preferably 2.80 to 3.20. When the specific gravity of the aluminum oxide thin film is less than 2.70, the structure of the thin film can be too coarse to provide a sufficient gas barrier property to the resultant film. When the specific gravity of the thin film is over 3.30, although the gas barrier property of the resultant film after forming the thin film is excellent, the mechanical property, especially the bending resistance of the resultant film is and the gas barrier property is largely degraded after the gelbo treatment because the thin film is too rigid. Thus such a film is not suitable for use as a gas barrier film.

When a composite oxide is a mixture including n kinds of oxides, a specific gravity of the composite oxide is calculated as follows:

$$Z = a_1 X_1 + a_2 X_2 + \ldots + a_n X_n$$

$$\sum_{1}^{n} a_i = 1$$

wherein $X_1$, $X_2$, ... and $X_n$ are respective specific gravities of the n kinds of the oxides; and Z is the specific gravity of the composite oxide.

For example, when the composite oxide comprises two oxides, the specific gravity of the composite oxide (Z) is calculated by the following formula:

$$Z = aX + (1-a)X'$$

wherein X and X' are respectively specific gravities of the oxides, a and (1–a) are proportions of the oxides in the composite oxide, respectively.

When the thin film comprises a composition containing a composite oxide of aluminum oxide and silicon oxide as a main component, the following formula is satisfied:

$$D = 0.01A + b$$

wherein D is a specific gravity of the thin film and A is a content (% by weight) of aluminum oxide in the composition. In this formula, b is preferably 1.6 to 2.2, and more preferably 1.7 to 2.1. When b is less than 1.6, the structure of the thin film can be too coarse to provide a sufficient gas barrier property to the resultant film. When b is over 2.2, although the gas barrier property of the resultant film after forming the thin film is excellent, the mechanical property, especially the bending resistance of the resultant film is inferior and the gas barrier property is largely degraded after the gelbo treatment because the thin film is too rigid. Thus such a film is not suitable for use as a gas barrier film.

When the thin film comprises a composition containing magnesium oxide and silicon oxide as main components, the following formula is satisfied:

$$D = 0.011B + b$$

wherein D is a specific gravity of the thin film, and B is a content (% by weight) of magnesium oxide. In this formula, b is preferably 1.6 to 2.3, and more preferably 1.7 to 2.2. When b is less than 1.6, the structure of the thin film can be too coarse to provide a sufficient gas barrier property to the resultant film. When b is over 2.3, although the gas barrier property of the resultant film after forming the thin film is excellent, the mechanical property, especially the bending resistance of the resultant film is inferior and the gas barrier property is largely degraded after the gelbo treatment because the thin film is too rigid. Thus such a film is not suitable for use as a gas barrier film.

A thickness of the thin film is not limited to, but preferably 50 to 8000 angstroms in view of the gas barrier property and flexibility, more preferably 70 to 5000 angstroms and most preferably 100 to 3000 angstroms.

The gas barrier film of the present invention is produced as follows:

The plastic film is obtained as follows: an organic polymer is melt-extruded, and oriented longitudinally and/or perpendicular to the longitudinal direction, if necessary. Then the polymer is cooled down and thermo-set.

The surface of the plastic film can be treated by corona discharge, glow discharge or anchor coating before forming the thin film so as to improve adhesiveness to the thin film unless the satisfactory properties of the film of the present invention are lost. The plastic film can be further provided with printing and/or decoration.

The thin film is formed on the plastic film by PVD (physical vapor deposition) such as a vacuum evaporation, a sputtering evaporation, and an ion plating evaporation or CVD (chemical vapor deposition). For example, in the vacuum evaporation, evaporation source materials are heated by resistance heating, high frequency heating or electron beam heating. When a thin film comprising a composition containing silicon oxide as a main component is formed, Si, SiO, $SiO_2$ and the like are used as the evaporation source materials. When a thin film comprising a composition containing aluminum oxide as a main component is formed, Al, $Al_2O_3$ and the like are used as the evaporation source materials. When a thin film comprising a composition containing aluminum oxide and silicon oxide as main components is formed, a combination of $Al_2O_3$ and $SiO_2$, a combination of Al and $SiO_2$ and the like are used as the evaporation source materials. When a thin film comprising a composition containing magnesium oxide and silicon oxide as main components is formed, a combination of MgO and $SiO_2$, a combination of MgO and Si and the like are used as the evaporation source materials. When two or more kinds of the evaporation source materials are used, each material is separately loaded into different crucibles or into a hearth divided by a carbon plate. Each source material is spontaneously heated by different heating sources. When the heating source is an electron beam gun (hereinafter referred to as the "EB gun"). A ratio of emission time to respective source materials is, for example, preferably 10:10 to 60:10 in the case of using Si and $SiO_2$ as the source materials. In the case of using Al and $Al_2O_3$, the ratio is preferably 10:30 to 10:60. In the case of using $Al_2O_3$ and $SiO_2$, the ratio is preferably 30:10 to 70:10. In the case of using a combination of MgO and $SiO_2$ or a combination of CaO and $SiO_2$, the ratio is preferably 5:10 to 50:10. In the case of using $Al_2O_3$, MgO and $SiO_2$, the ratio is preferably 10:10:50 to 50:50:10.

Furthermore, thin films with various specific gravities can be formed by varying conditions of the evaporation. Such conditions include an emission current of the EB gun and a vapor pressure. Generally, the plastic films to be evaporated are conveyed at a determined rate during the evaporation, and the speed at which the films are conveyed (i.e., the line speed) is included as one of the conditions.

The emission current of the EB gun is, for example, preferably 0.8 to 1.5 Ampere (A) in the case of using Si and $SiO_2$. In the case of using a combination of Al and $Al_2O_3$, a combination of CaO and $SiO_2$, a combination of $Al_2O_3$, MgO and $SiO_2$, the current is preferably 1.0 to 2.0 A. In the case of using $Al_2O_3$ and $SiO_2$, the current is preferably 0.8 to 2.2 A. In the case of using MgO and $SiO_2$, the current is preferably 0.8 to 2.5 A.

The line speed of the plastic film is, for example, preferably 60 to 120 m/minute (min.) in the case of using Si and $SiO_2$ as the evaporation source material in the electron evaporation. In the case of using Al and $Al_2O_3$, the rate is preferably 40 to 100 m/min. In the case of a combination of CaO and $SiO_2$, a combination of $Al_2O_3$, MgO and $SiO_2$, the rate is preferably 60 to 150 m/min. In the case of using $Al_2O_3$ and $SiO_2$, the rate is preferably 10 to 200 m/min. In the case of using MgO and $SiO_2$, the rate is preferably 10 to 200 m/min. In the case of using Al in the high frequency induction heating evaporation, the line speed is preferably 20 to 150 m/min.

The vapor pressure is, for example, preferably $1\times10^{-5}$ to $5\times10^{-3}$ Torr in the case of using Si and $SiO_2$ as the evaporation source materials in the electron evaporation. In the case of using Al and $Al_2O_3$, the pressure is preferably $1\times10^{-5}$ to $8\times10^{-3}$ Torr. In the case of using a combination of CaO and $SiO_2$ and a combination of $Al_2O_3$, MgO and $SiO_2$, the pressure is preferably $1\times10^{-5}$ to $5\times10^{-3}$ Torr. In the case of using $Al_2O_3$ and $SiO_2$, the pressure is preferably $1\times10^{-5}$ to $8\times10^{-4}$ Torr. In the case of using MgO and $SiO_2$, the pressure is preferably $1\times10^{-5}$ to $8\times10^{-3}$ Torr. When Al is evaporated by the high frequency induction heating evaporation, the vapor pressure is preferably $1\times10^{-5}$ to $8\times10^{-3}$ Torr.

As a reactive gas used in the vacuum evaporation, oxygen, nitrogen, vapor or the like is used. A reactive evaporation using an ozone addition or ion assist can be performed instead of introducing such gas.

In the vacuum evaporation, a bias voltage can be applied to a substrate, or the substrate can be heated or cooled down unless the objectives of the present invention are spoiled. Also in other production methods such as the sputtering evaporation or CVD, the production conditions can be varied.

The gas barrier film obtained in the above-mentioned manner can be used singly or other organic polymer films or thin layers can be laminated or coated thereon. An example includes but is not limited to the practical use of a lamination structure of an unoriented polypropylene film/an adhesive layer/a silicon oxide type thin layer/a polyethylene terephthalate film/an adhesive layer/a printed layer/a polyethylene terephthalate film.

The gas barrier film obtained in the above-mentioned manner is suitable for use in wrapping materials which can be used in an electronic oven, sterilized by micro waves and in which a free-oxygen absorber functions effectively for wrapping dried food, liquid food or food containing a liquid, frozen food and retort food.

Examples of the dried food are not limited to but include snacks such as potato chips and popcorn; quickly prepared noodles; table luxuries such as tea and coffee; grains such as flour, rice and wheat.

As a material for wrapping the dried food, the gas barrier film of the present invention can be laminated on various films and/or paper. The kinds of gas barrier film and the films and/or paper depend upon characteristics desired by the content to be wrapped. Typical examples include a laminate comprising a polyethylene film laminated on a thin film (i.e., the oxide film) in a gas barrier film of the present invention comprising a polyethyleneteroohthalate (PET) film as a base film; one comprising an unoriented polypropylene film laminated on the thin film of the gas barrier film of the present invention comprising a PET film as a base film; one comprising a nylon film and a polyethylene film successively laminated on the thin film in a gas barrier film of the present invention comprising a PET film as a base film; and one comprising a polyethylene film laminated on the thin film in a gas barrier film of the present invention comprising a nylon film as a base film. The method for laminating these films is not limited, but a dry laminate and an extrusion laminate are preferable. Moreover, the gas barrier film can bear a printing, for example, instructions for the use of the contents and the like or can be adhered to a film for decoration or as a reinforcing film.

Examples of liquid food or food containing a liquid are not limited to but include various pickles; miso; food contained together with sause; and seasonings such as sause, ketchup and mayonnaise.

As a material for wrapping the liquid food or food containing a liquid, various films can be laminated on the gas barrier film depending upon characteristics desired by the content to be wrapped. Typical examples include a laminate comprising a polyethylene film laminated on the thin film in a gas barrier film of the present invention comprising a nylon film as a base film; one comprising an unoriented polypropylene film laminated on the thin film in a gas barrier film of the present invention comprising a nylon film as a base film; one comprising a polyethylene film laminated on the thin film in a gas barrier film of the present invention comprising a PET film as a base film; and one comprising an unoriented polypropylene film laminated on the thin film in a gas barrier film of the present invention comprising a PET film as a base film. The method for laminating these films is not limited, but a dry laminate and an extrusion laminate are preferable. Moreover, the gas barrier film can bear a printing, for example, instructions for the use of the contents and the like or can be adhered to a film for decoration or as a reinforcing film.

Furthermore, wrapping bodies can be produced by sticking the gas barrier film onto paper and the like and shaping it into a desired form. The wrapping body is not limited in its shape. Examples include a bag (including a pillow type bag, a paper carton, a three-sided seal bag and a four-sided seal bag), a lid material, a cup, a tube, a standing pack and a lidded container. The gas barrier film of the present invention is used as a whole or a part of such a wrapping material and a wrapping body.

The paper carton means a container made of composite paper. The composite paper can be a laminate of the gas barrier film of the present invention on a plastic film and the like. The shape of the paper carton is not limited to but includes a gable top type, a brick type, a rectangular parallelepiped and a cup-like shape. Such a container may have an inner bag or an inlet.

Examples of contents which can be contained in such a paper carton include drinks such as milk, yogurt, juice, and soda drinks; alcohols such as sake and whisky; and seasonings such as soy sause and other sauses.

Further, the gas barrier film can be used for cutting off gas for industrial use.

EXAMPLES

The present invention will now be described by way of examples. Each thin film in each gas barrier film obtained in examples and comparative examples described below was evaluated as follows:

(1) A method for measuring an oxygen permeability:

The amount of oxygen permeated through a film was measured by an oxygen permeability measuring apparatus (produced by MODERN CONTROLS, INC., OX-TRAN 100 (a trade name)) to calculate the amount of oxygen permeated per 1 $m^2$ and 24 hours under 1 atmospheric pressure as an oxygen permeability.

(2) A method for retorting:

A sample film was allowed to stand at a temperature of 120° C. for 30 minutes.

(3) A method for the gelbo treatment:

A sample film with a size of 11.2 inches×8 inches was shaped into the form of a hollow cylinder having a diameter of 3.5 inches. The cylinder was grasped at two positions near the respective ends with an interval of 7 inches therebetween by using a Gelbo Flex Tester (MIL-B131H) (produced by RIGAKU KOGYO CO., LTD.), and then twisted at a temperature of 20° C. under a relative humidity of 65% by 400 degrees so as to make the distance between the grasping positions to be 3.5 inches. This action was repeated at a rate of 40 times/min.

(4) A method for measuring a vapor permeabilty:

A vapor permeability was measured in accordance with JIS K 7129.

Example 1

Si with purity of 99.99% and $SiO_2$ with purity of 99.9% both in the shape of particles with a diameter of about 3 to 5 mm were used as evaporation source materials. They were evaporated upon one surface of respective PET films (produced by Toyo Boseki Kabushiki Kaisha; E5007) with a thickness of 12 µm by an electron beam evaporation (hereinafter referred to as the "EB evaporation") to form silicon oxide gas barrier thin films respectively having a thickness of 300 to 1000 angstroms as shown in Table 1. The evaporation source materials were not mixed but loaded separately into a hearth divided into two portions with a carbon plate. The EB gun (hereinafter called the "EB gun") was used as a heating source, and the loaded Si and $SiO_2$ were heated separately. The thickness of each thin film was controlled by varying the following conditions within the following ranges: an emission current of the EB gun from 0.8 to 1.5 A; a ratio of emission time to Si to that to $SiO_2$ from 10:10 to 60:10; a PET line speed from 60 to 120 m/min.; and a vapor pressure from $1\times10^{-5}$ to $5\times10^{-3}$ Torr by varying a supply amount of oxygen gas. Under such various conditions, six kinds of the thin films as shown in Table 1 were formed on the PET films, respectively, thereby obtaining gas barrier films.

After dissolving the PET film of each of the obtained gas barrier films, a specific gravity of each thin film was measured by the sink and float method. A ratio of the measured specific gravity to that of silicon dioxide (quartz), 2.65, was calculated. The amount of permeated oxygen was further measured to calculate the oxygen permeability of each thin film at this point. The results are shown in Table 1.

Comparative Example 1

Three kinds of silicon oxide gas barrier thin films were formed in the same manner as in Example 1 except that Si and $SiO_2$ as the evaporation source materials were mixed and a thickness of each thin film was made to be 1000 angstroms. A ratio of the specific gravity of each thin film to that of quartz and the oxygen permeability were obtained in the same manner as in Example 1. The results are shown in Table 1. Each film obtained in Comparative Example 1 was found to be inferior in the barrier property, having a smaller specific gravity.

The results of Example 1 and Comparative Example 1 are shown in FIG. 1 as a graph showing a ratio of the specific gravity of each of the obtained silicon oxide gas barrier thin films to that of quartz (i.e., a standard oxide) as the axis of ordinates and the oxygen permeability of the thin film as the axis of abscissas. The thin films obtained in Example 1 (indicated by ○) had 55% or more of the above ratio and excellent oxygen gas barrier properties. However, the thin films obtained in Comparative Example 1 (indicated by X) had less than 55% of the above ratio and inferior oxygen gas barrier properties.

Example 2

Al with purity of 99.99% and $Al_2O_3$ with purity of 99.9% both in the shape of particles with a diameter of about 3 to 5 mm were used as evaporation source materials. They were evaporated upon one surface of respective PET films (produced by Toyo Boseki Kabushiki Kaisha; E5100) with a thickness of 12 µm by the EB evaporation to form aluminum oxide gas barrier thin films respectively having a thickness of 300 to 5000 angstroms. The evaporation source materials were not mixed but loaded separately into a hearth divided into two portions with a carbon plate. The EB gun was used as a heating source, and the loaded Al and $Al_2O_3$ were each heated separately. The thickness of the thin films was controlled by varying the following conditions within the following ranges: an emission current of the EB gun from 1.0 to 2.0 A; a ratio of emission time to Al to that to $Al_2O_3$ from 10:30 to 10:60; a PET line speed from 40 to 100 m/min.; and a vapor pressure from $1\times10^{-5}$ to $8\times10^{-3}$ Torr by varying a supply amount of oxygen gas. Under such various conditions, eleven kinds of the thin films as shown in Table 2 were formed on the PET films, respectively, thereby obtaining gas barrier films.

After dissolving the PET film of each of the obtained gas barrier films, a specific gravity of each thin film was measured by the sink and float method. A ratio of the measured specific gravity to that of α-Al₂O₃, 3.97, was calculated. The amount of permeated oxygen was further measured to calculate the oxygen permeability of each thin film at this point.

The following experiments were conducted on the gas barrier films which were not used for the measurement of the specific gravity. A wrapping film was obtained by dry laminating an unoriented polypropylene film (hereinafter called the "CPP film") with a thickness of 60 $\mu$m on each thin film formed on the PET film by using a two-component polyurethane adhesive (with a thickness of 4 $\mu$m). After the retorting or the gelbo treatment (for 5 minutes) was performed, the amount of permeated oxygen was measured to obtain the oxygen permeability. The results are shown in Table 2.

Example 3

Aluminum oxide gas barrier thin films were formed in the same manner as in Example 2 except that the vapor pressure during the evaporation was $1 \times 10^{-5}$ to $5 \times 10^{-4}$ Torr and a cooling temperature of the chill roller was $-20°$ C. to $-50°$ C. and a thickness of each of the obtained thin films was in the range of 3000 to 5000 angstroms. A ratio of the specific gravity of each thin film to that of α-Al₂O₃ and the oxygen permeability were obtained in the same manner as in Example 2. The results are shown in Table 2.

Comparative Example 2

Aluminum oxide gas barrier thin films were formed in the same manner as in Example 2 except that Al and Al₂O₃ as the evaporation source materials were mixed and a thickness of each of the obtained thin films was in the range of 500 to 1000 angstroms. A ratio of the specific gravity of each thin film to that of α-Al₂O₃ and the oxygen permeability were obtained in the same manner as in Example 2. The results are shown in Table 2.

The gas barrier films obtained in Example 2 showed an excellent oxygen barrier property, having an oxygen permeability of 3.0 cc/m².atm.day or less before the gelbo treatment. After the gelbo treatment for 5 minutes, the films were excellent in the oxygen barrier property, having the oxygen permeability raised by about 2 cc/m².atm.day or less. Furthermore, the gas Ad barrier films obtained in Example 2 also had satisfactory oxygen barrier properties after retorting. The films obtained in Example 3 were excellent in the oxygen barrier property as in Example 2 except that the films were subjected to the gelbo treatment. The films obtained in Comparative Example 2 have a lower specific gravity and were inferior in the oxygen barrier property.

Example 4

Al with purity of 99.9% in the shape of particles with a diameter of about 3 to 5 mm were used as evaporation source material. The Al was evaporated upon one surface of respective PET films (produced by Toyo Boseki Kabushiki Kaisha; E5100) with a thickness of 12 $\mu$m by the radio frequency (R.F.) induction heating evaporation to form aluminum oxide gas barrier thin, films respectively having a thickness of 500 to 4000 angstroms under the following conditions: a high frequency electric power was 5 kW, a line speed was 20 to 150 m/min.; and a vapor pressure was varied from $1 \times 10^{-5}$ to $8 \times 10^{-3}$ Torr by varying the amount of oxygen gas supply. Moreover, a voltage of $-1$ kV was applied from a mesh-like electrode provided in front of a chill roller (cooling roller). Four kinds of Gas barrier films were obtained by respectively forming the thin films on the PET films.

After dissolving the PET film of each of the obtained gas barrier films, a specific gravity of each thin film was measured by the sink and float method. A ratio of the measured specific gravity to that of α-Al₂O₃, 3.97, was calculated. The amount of permeated oxygen permeability was further measured to calculate the oxygen permeability of each thin film at this point.

The following experiments were conducted on the gas barrier films which were not used for the measurement of the specific gravity. A wrapping film was obtained in the similar method as in Example 2. After the retorting or the gelbo treatment was performed, the amount of permeated oxygen was measured to obtain the oxygen permeability. The results are shown in Table 3.

Example 5

Aluminum oxide gas barrier thin film was obtained in the similar manner as in Example 4 except that the vapor pressure during the evaporation was $1 \times 10^{-5}$ to $5 \times 10^{-4}$ Torr and a cooling temperature of the chill roller was $-20°$ C. to $-10°$ C. A ratio of the specific gravity of the obtained thin film to that of α-Al₂O₃ and the oxygen permeability was obtained in the same manner as in Example 4. The results are shown in Table 3.

Comparative Example 3

Aluminum oxide gas barrier thin films were obtained in the same manner as in Example 4 except that an electric field was not applied during the evaporation by the R.F. induction heating. A ratio of the specific gravity of each of the obtained thin films to that of α-Al₂O₃ and the oxygen permeability were obtained in the same manner as in Example 4. The results are shown in Table 3.

The gas barrier films obtained in Example 4 showed an excellent oxygen barrier property, having an oxygen permeability of 3.0 cc/m².atm.day or less before the gelbo treatment. After the gelbo treatment for 5 minutes, the films were excellent in the oxygen barrier property, having the oxygen permeability raised by about 2 cc/m².atm.day or less. Furthermore, the gas barrier films obtained in Example 4 also had satisfactory oxygen barrier properties after retorting.

The film obtained in Example 5 was excellent in the oxygen barrier property as in Example 4 except that the film was subjected to the gelbo treatment. The films obtained in Comparative Example 3 have a lower specific gravity and were inferior in the oxygen barrier property.

Example 6

The following were used as evaporation sources materials: MgO with purity of 99.5% and SiO₂ with purity of 99.9% (Samples 6-1 to 6-3); CaO with purity of 99.5% and SiO₂ with purity of 99.9% (Samples 6-4 to 6—6); and Al₂O₃ with purity of 99.5%, MgO with purity of 99.5% and SiO₂ with purity of 99.9% (Samples 6-7 to 6-9). All the evaporation source materials were in the shape of particles with a diameter of 3 to 5 mm. The evaporation source materials were evaporated by the EB evaporation on one surface of respective PET films (produced by Toyo Boseki Kabushiki Kaisha; E5100) with a thickness of 12 $\mu$m to obtain nine kinds of gas barrier thin films. The evaporation source materials were not mixed but loaded separately into different crucibles. The ESB gun was used as a heating source, and each evaporation source material was heated separately. The following evaporation conditions were controlled within the following ranges so as to make a composition and a thickness in each thin film uniform: an emission current of the EB gun from 1.0 to 2.0 A; a ratio of emission time from 5:10 to 50:10 (in using two materials), and 10:10:50 to 50:50:10 (in using three materials); a line speed from 80 to 150 m/min.;

and the vapor pressure from $1\times10^{-5}$ to $5\times10^{-3}$ Torr by varying a supply amount of oxygen gas. Thus, nine kinds of gas barrier films were obtained by respectively forming thin films with a thickness of 500 angstroms; on each PET film.

After dissolving the PET film of each of the obtained gas barrier films, a specific gravity of each thin film was measured by the sink and float method. A, ratio of the measured specific gravity to that of the composite oxide was calculated. The amount of permeated oxygen was further measured to calculate the oxygen permeability of each thin film at this point. The results are shown in Table 4.

Comparative Example 4-1

Gas barrier thin films were obtained in the same manner as in Example 6 except that the evaporation source materials were mixed and loaded into one crucible, respectively. As a result, it was difficult to form a thin film with a low mixing ratio of $SiO_2$. When an attempt to make a thin film with a high mixing ratio of $SiO_2$ at a constant temperature during the evaporation was tried, the resulting thin film had a different composition from that in a crucible because the vapor pressure of each component was different. Moreover, the mixing ratio of the components in the crucible was varied because each component had a different evaporation tendency. As a result, the composition of the thin film obtained in the end was different from that obtained at the beginning. Thus, it was impossible to obtain a thin film with a fixed composition.

Comparative Example 4-2

Three kinds of gas barrier thin films were formed in the same manner as in Example 6 except that the vapor pressure during the evaporation was $8\times10^{-3}$ to $15\times10^{-3}$ Torr. A ratio of the specific gravity of each of the obtained thin films to that of the composite oxide and the oxygen permeability were obtained in the same manner as in Example 6. The results are shown in Table 4.

The thin films obtained in Example 6 had satisfactory oxygen barrier properties, having the oxygen permeability of 1 to 4 $cc/m^2$.atm.day or less. The thin films obtained in Comparative Example 4-2 had low specific gravities. The ratio of the specific gravity of each of the thin films to that of the composite oxide was less than 55%. The oxygen permeability was 20 $cc/m^2$.atm.day or more. Thus the thin films obtained in Comparative Example 4-2 were inferior in the oxygen barrier property.

Example 7

$Al_2O_3$ with purity of 99.5% and $SiO_2$ with purity of 99.9% both in the shape of particles with a diameter of about 3 to 5 mm were used as evaporation source materials. They were evaporated upon one surface of respective PET films (produced by Toyo Boseki Kabushiki Kaisha; E5100) with a thickness of 12 $\mu$m by the EB evaporation to form five kinds of aluminum oxide-silicon oxide gas barrier thin films. The evaporation source materials were not mixed but loaded separately into a hearth divided into two portions with a carbon plate. The EB gun was used as a heating source, and the loaded $Al_2O_3$ and $SiO_2$ were each heated separately. An emission current of the EB gun was 2.0 A. A ratio of emission time was varied from 30:10 to 70:10 so as to make a composition and a thickness of each thin film uniform. A line speed was 50 m/min. A supply amount of oxygen gas was 130 ccM. The cooling temperature of the chill roller was kept at $-10°$ C. Thus, five kinds of gas barrier films were obtained by respectively forming a thin film with a thickness of about 800 angstroms on each PET film. The conditions for forming these films are shown in Table 5A.

After dissolving the PET film of each of the obtained gas barrier films, a specific gravity of each thin film was measured by the sink and float method. A ratio of the measured specific gravity to that of the composite oxide was calculated.

The following experiments were conducted on the gas barrier films which were not used for the measurement of the specific gravity. A wrapping film was obtained by dry laminating the CPP film with a thickness of 40 $\mu$m on each thin film formed on the PET film by using a two-component polyurethane adhesive (with a thickness of 4 $\mu$m). The amount of the permeated oxygen at this point was measured to calculate the oxygen permeability. Furthermore, after the retorting or the gelbo treatment (for 5 minutes) was performed, the amount of permeated oxygen was measured to obtain the oxygen permeability. The results are shown in Table 5B.

Example 8

An aluminum oxide/silicon oxide gas barrier thin film was formed in the same manner as in Example 7 except that the ratio of emission time was 10:10. The ratio of the specific gravity of the resultant thin film to that of the composite oxide and the oxygen permeability were obtained in the same manner as in Example 7. The results are shown in Table 5B.

The gas barrier films obtained in Example 7 showed an excellent oxygen barrier property, having an oxygen permeability of 1.0 $cc/m^2$.atm.day or less before the gelbo treatment. After the gelbo treatment for 5 minutes, the films were excellent in the oxygen barrier property, having the oxygen permeability raised by about 1 $cc/m^2$.atm.day or less. Furthermore, the gas barrier films obtained in Example 7 also had satisfactory oxygen barrier properties after the retorting. The oxygen barrier property of the film obtained in Example 8 before the retorting was excellent as that of the films obtained in Example 7. Accordingly, the desirable content of $Al_2O_3$ in the thin film is in the range of 20% by weight to 99% by weight when an excellent retort property is required.

Example 9

$Al_2O_3$ with purity of 99.5% and $SiO_2$ with purity of 99.9% both in the shape of particles with a diameter of about 3 to 5 mm were used as evaporation source materials. They were evaporated upon one surface of respective PET films (produced by Toyo Boseki Kabushiki Kaisha; E5007) with a thickness of 12 $\mu$m by the EB evaporation to form aluminum oxide/silicon oxide gas barrier thin films as shown in Tables 6A through 6D. The evaporation source materials were not mixed but loaded separately into a hearth divided into two portions with a carbon plate. The EB gun was used as a heating source, and the loaded $Al_2O_3$ and $SiO_2$ were each heated separately. The thickness of each thin film was controlled by varying the following conditions within the following ranges: an emission current of the EB gun from 0.8 to 2.2 A; ratio of emission time to $Al_2O_3$ to that to $SiO_2$ from 10:10 to 50:1; a line speed from 10 to 200 m/min.; a supply amount of oxygen gas from 0 to 200 ccM; a vapor pressure from $1\times10^{-5}$ to $2\times10^{-3}$ Torr; and; a cooling temperature of the chill roller from $-20°$ to $70°$ C. Thus, eighteen kinds of gas barrier films were obtained by respectively forming a thin film with a thickness of about 400 to 4000 angstroms on each PET film.

After dissolving the PET film of each of the obtained gas barrier films, a specific gravity of each resultant thin film was measured by the sink and float method. A ratio of the measured specific gravity to that of the composite oxide was calculated.

Wrapping films were obtained in the same manner as in Example 7. The amount of permeated oxygen at this point was measured to calculate the oxygen permeability. Furthermore, after the retorting or the gelbo treatment (for 5 minutes) was performed, the amount of permeated oxygen was measured to obtain the oxygen permeability. The results are shown in Tables 6A through 6D.

Example 10

Aluminum oxide/silicon oxide gas barrier thin films were formed in the same manner as in Example 9 except that the vapor pressure during the evaporation was $1\times10^{-5}$ to $5\times10^{-4}$ Torr and a cooling temperature of the chill roller was $-20°$ C. to $-5°$ C. The ratio of the specific gravity of each thin film to that of the composite oxide and the oxygen permeability were obtained in the same manner as in Example 9. The results are shown in Tables 6A through 6D.

Comparative Example 5

Aluminum oxide/silicon oxide gas barrier thin films were formed in the same manner as in Example 9 except that the vapor pressure during the evaporation was $2\times10^{-3}$ to $15\times10^{-3}$ Torr and a cooling temperature of the chill roller was not controlled. The ratio of the specific gravity of each thin film to that of the composite oxide and the oxygen permeability were obtained in the same manner as in Example 9. The results are shown in Tables 6A through 6D.

The gas barrier films obtained in Example 9 showed an excellent oxygen barrier property, having an oxygen permeability of 1.0 $cc/m^2.atm.day$ or less before the gelbo treatment. After the gelbo treatment for 5 minutes, the films were excellent in the oxygen barrier property, having the oxygen permeability raised by about 3 $cc/m^2.atm.day$ or less. Furthermore, the gas barrier films obtained in Example 9 also had satisfactory oxygen barrier properties after the retorting. The films obtained in Example 10 were excellent in the oxygen barrier property as in Example 9 except that the films were subjected to the gelbo treatment. The films obtained in Comparative Example 5 were inferior in the oxygen barrier property. After the retorting, the films were further inferior in the oxygen barrier property.

Example 11

MgO with purity of 99.5% and $SiO_2$ with purity of 99.9% both in the shape of particles with a diameter of about 3 to 5 mm were used as evaporation source materials. They were evaporated upon one surface of respective PET films (produced by Toyo Boseki Kabushiki Kaisha; E5100) with a thickness of 12 $\mu$m by the EB evaporation to form magnesium oxide/silicon oxide gas barrier thin films. The evaporation source materials were not mixed but loaded separately into a hearth divided into two portions with a carbon plate. The EB gun was used as a heating source, and the loaded Mgo and $SiO_2$ were each heated separately. The following conditions were varied within the following ranges: an emission current of the EB gun from 1.0 to 2.0 A; and a ratio of emission time from 5:10 to 30:10. A line speed was settled so as to make uniform the thickness of each thin film to be formed. A supply amount of oxygen gas was 130 ccM. A cooling temperature of the chill roller was kept at $-10°$ C. Thus, five kinds of thin films with a thickness of about 400 angstroms were formed on each PET film.

After dissolving the PET film of each of the obtained gas barrier films, a specific gravity of each thin film was measured by the sink and float method. A ratio of the measured specific gravity to that of the composite oxide was calculated.

The following experiments were conducted on the gas barrier films which were not used for the measurement of the specific gravity. Wrapping films were obtained by dry laminating the CPP film with a thickness of 40 $\mu$m on each thin film formed on the PET film by using a two-component polyurethane adhesive (with a thickness of 2 $\mu$m). The amount of permeated oxygen at this point and a vapor permeability were obtained. Furthermore, after the gelbo treatment (for 12.5 minutes) was performed, the amount of permeated oxygen and the vapor permeability were obtained. The results are shown in Table 7.

Example 12

A magnesium oxide/silicon oxide gas barrier thin film was formed in the same manner as in Example 11 except that the ratio of emission time was 50:10. The ratio of the specific gravity of the resultant thin film to that of the composite oxide and the oxygen and the vapor permeability were obtained in the same manner as in Example 9. The results are shown in Table 7.

The gas barrier films obtained in Example 11 showed an excellent oxygen barrier property, having the oxygen permeability of 2.5 $cc/m^2.atm.day$ or less before the gelbo treatment. After the gelbo treatment was performed for 12.5 minutes, the films were excellent in the oxygen barrier property, having the oxygen permeability raised by about 1 $cc/m^2.atm.day$ or less. Furthermore, the gas barrier films obtained in Example 11 also had a satisfactory oxygen barrier property after the gelbo treatment. The vapor permeability thereof was also excellent. The thin film obtained in Example 12 was relatively inferior in the vapor barrier property and excellent in the oxygen barrier property.

Example 13

Magnesium oxide/silicon oxide gas barrier thin films were formed on respective PET films (produced by Toyo Boseki Kabushiki Kaisha; E5001) with a thickness of 12 $\mu$m by the EB evaporation in the same manner as in Example 11 except for varying the following conditions within the following ranges: an emission current of the EB gun from 0.8 to 2.5 A; a ratio of emission time from 5:10 to 30:10; a line speed from 10 to 200 m/min.; a supply amount of oxygen gas from 10 to 500 ccM; a vapor pressure from $1\times10^{-5}$ to $2\times10^{-3}$ Torr; and a cooling temperature of the chill roller from $-20°$ to $70°$ C. Thus, thin films each having a thickness of 300 to 3000 angstroms were formed respectively on each PET film. The ratio of the specific gravity of each thin film was measured in the same manner as in Example 11. Furthermore, wrapping films were obtained in the same manner as in Example 11, and the oxygen barrier property and the vapor barrier property were measured. But the gelbo treatment in Example 13 was performed for 12.5 minutes. The results are shown in Tables BA and 8B.

Example 14

Magnesium oxide/silicon oxide gas barrier thin films were formed in the same manner as in Example 13 except that a vapor pressure during the evaporation was $1\times10^{-5}$ to $2\times10^{-4}$ Torr and a cooling temperature of the chill roller was $-20°$ C. to $-5°$ C. The ratio of the specific gravity, the oxygen barrier property and the vapor barrier property of each thin film, and the oxygen barrier property and the vapor barrier property of each thin film after the gelbo treatment were obtained in the same manner as in Example 13. The results are shown in Tables 8A and 8B.

Comparative Example 6

Magnesium oxide/silicon oxide gas barrier thin films were formed in the same manner as in Example 10 except that a vapor pressure during the evaporation was $2\times10^{-3}$ to $15\times10^{-3}$ Torr and a cooling temperature of the chill roller was not controlled. The ratio of the specific gravity, the oxygen barrier property and the vapor barrier property of each thin film, and the oxygen barrier property and the vapor barrier property of each thin film after the gelbo treatment were obtained in the same manner as in Example 13. The results are shown in Tables 8A and 8B.

The gas barrier films obtained in Example 13 showed an excellent gas barrier property, having the oxygen permeability of 2.5 cc/m$^2$.atm.day or less before the gelbo treatment. After the gelbo treatment was performed for 12.5 minutes, the films were excellent in the gas barrier property, having the oxygen permeability raised by about 3 cc/m$^2$.atm.day or less. The vapor permeability thereof was also satisfactory. The films obtained in Example 14 were excellent in both of the oxygen barrier property and the vapor barrier property before the gelbo treatment. The film obtained in Comparative Example 6 were inferior in both the oxygen barrier property and the vapor barrier property.

Example 15

A silicon oxide gas barrier film with a thickness of 700 angstroms was formed on one surface of a PET film with a thickness of 12 μm by the EB evaporation using Si and SiO$_2$ used in Example 1 under the conditions used for Sample 1-3. A CPP film with a thickness of 40 μm was dry laminated on the evaporated film using an urethane type adhesive. An oriented polypropylene film (hereinafter referred to as the "OPP film") bearing a printing thereon was dry laminated on the other surface of the PET film. The resultant film was heat sealed to produce a bag with a size of 30 cm×20 cm. The gelbo treatment was performed for 2.5 minutes by using a gelbo tester. Then potato chips were bagged therein, and the opening was heat sealed. The bag was allowed to stand in a room at a temperature of 25° C. with a relative humidity of 65% for 6 months. An eating quality test after that time found that the color, taste and dryness of the potato chips were not changed.

Comparative Example 7

An OPP film bearing a printing thereon was dry laminated on the film obtained in Comparative Example 1-2 to produce a bag with a size of 30 cm×20 cm. As in Example 15, the gelbo treatment was performed for 2.5 minutes by using the gelbo tester, potato chips were bagged therein, and the bag was allowed to stand in a room at a temperature of 25° C. with a relative humidity of 65% for 6 months. The eating quality test found that the potato chips had changed color a little, had a slight oxidized flavor, had absorbed moisture and had a less crisp touch.

Example 16

A CPP film with a thickness of 40 μm was dry laminated on the magnesium oxide/silicon oxide gas barrier film obtained in Example 11-2. Paper bearing a lamination of polyethylene thereon was laminated on the other surface of the PET film to form a sheet with a structure of polyethylene/paper/MgO-SiO$_2$ evaporated PET/CPP. The resultant sheet was heat sealed to form a paper carton. The oxygen permeability of the paper carton was 0.5 cc/m$^2$.atm.day, which is equivalent to that of a conventional paper carton bearing a lamination of an aluminum foil with a thickness of 7 μm. The paper carton could preserve liquid food for 6 months without causing oxidation.

It was difficult to recycle the conventional paper carton. However, the paper carton of this example could be easily recycled to produce paper.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

TABLE 1

| Sample No. | Specific Gravity of Thin Film | Ratio A* (%) | Thickness of Thin Film (angstroms) | Oxygen Permeability (cc/m$^2$ · atm · day) |
|---|---|---|---|---|
| Example 1: | | | | |
| 1 | 1.70 | 64.0 | 300 | 3.0 |
| 2 | 1.80 | 67.9 | 300 | 2.8 |
| 3 | 1.87 | 70.6 | 700 | 2.0 |
| 4 | 1.90 | 71.7 | 700 | 1.8 |
| 5 | 2.05 | 77.4 | 1000 | 1.4 |
| 6 | 2.12 | 80.0 | 1000 | 1.0 |
| Comparative Example 1: | | | | |
| 1 | 1.40 | 52.8 | 1000 | 50.0 |
| 2 | 1.35 | 50.9 | 1000 | 50.0 |
| 3 | 1.31 | 49.4 | 1000 | 80.0 |

*A ratio of a specific gravity of a standard oxide to that of a thin film

TABLE 2

| Sample No. | Specific Gravity | Ratio A* (%) | Thickness of Thin Film (angstroms) | Oxygen Permeability (cc/m$^2$ · atm · day) | | |
|---|---|---|---|---|---|---|
| | | | | Before Treatment | After Retorting | After Gelbo Treatment |
| Example 2: | | | | | | |
| 1 | 2.71 | 68.3 | 300 | 3.0 | 4.5 | 3.5 |
| 2 | 2.87 | 72.3 | 500 | 2.0 | 2.6 | 2.5 |
| 3 | 2.98 | 75.1 | 500 | 2.0 | 2.4 | 2.5 |
| 4 | 2.95 | 74.3 | 1000 | 1.6 | 2.0 | 2.0 |
| 5 | 3.02 | 76.1 | 1000 | 1.5 | 2.0 | 2.0 |
| 6 | 3.15 | 79.3 | 1000 | 1.5 | 1.8 | 2.1 |
| 7 | 3.14 | 79.1 | 2000 | 1.3 | 1.5 | 2.1 |
| 8 | 3.22 | 81.1 | 2000 | 1.3 | 1.4 | 2.3 |

TABLE 2-continued

| Sample No. | Specific Gravity | Ratio A* (%) | Thickness of Thin Film (angstroms) | Oxygen Permeability (cc/m² · atm · day) | | |
|---|---|---|---|---|---|---|
| | | | | Before Treatment | After Retorting | After Gelbo Treatment |
| 9 | 3.00 | 75.6 | 3000 | 1.2 | 1.4 | 2.5 |
| 10 | 3.15 | 79.9 | 3000 | 1.1 | 1.5 | 2.6 |
| 11 | 3.30 | 83.1 | 5000 | 0.9 | 1.3 | 3.0 |
| Example 3: | | | | | | |
| 1 | 3.32 | 83.6 | 3000 | 1.0 | 1.7 | over** |
| 2 | 3.35 | 84.4 | 5000 | 0.9 | 1.4 | over** |
| Comparative Example 2: | | | | | | |
| 1 | 2.10 | 52.9 | 500 | 10.0 | over** | 20.0 |
| 2 | 2.15 | 54.2 | 1000 | 10.0 | over** | 25.0 |

*A ratio of a specific gravity of a standard oxide to that of a thin film.
**The oxygen permeability was about 200 cc/m² · atm · day and could not be determined precisely.

TABLE 3

| Sample No. | Specific Gravity | Ratio A* (%) | Thickness of Thin Film (angstroms) | Oxygen Permeability (cc/m² · atm · day) | | |
|---|---|---|---|---|---|---|
| | | | | Before Treatment | After Retorting | After Gelbo Treatment |
| Example 4: | | | | | | |
| 1 | 2.72 | 68.5 | 500 | 2.8 | 4.3 | 3.2 |
| 2 | 3.03 | 76.3 | 1000 | 1.5 | 2.2 | 2.0 |
| 3 | 3.18 | 80.1 | 2000 | 1.2 | 1.4 | 2.4 |
| 4 | 3.27 | 82.4 | 4000 | 0.9 | 1.4 | 3.0 |
| Example 5: | | | | | | |
| — | 3.40 | 85.5 | 4000 | 0.7 | 1.8 | over** |
| Comparative Example 3: | | | | | | |
| 1 | 2.08 | 52.4 | 500 | 10.0 | over** | 20.0 |
| 2 | 2.16 | 54.4 | 1000 | 10.0 | over** | 28.0 |

*A ratio of a specific gravity of a standard oxide to that of a thin film.
**The oxygen permeability was about 200 cc/m² · atm · day and could not be determined precisely.

TABLE 4

| Sample No. | Composition (wt %) | | Specific Gravity | Ratio A* (%) | Oxygen Permeability (cc/m² · atm · day) |
|---|---|---|---|---|---|
| Example 6: | | | | | |
| 1 | (MgO)—(SiO₂) 15 85 | | 2.4 | 85.7 | 1.0 |
| 2 | (MgO)—(SiO₂) 15 85 | | 2.1 | 75.0 | 1.8 |
| 3 | (MgO)—(SiO₂) 15 85 | | 1.9 | 67.9 | 2.2 |
| Comparative Example 4-2: | | | | | |
| 1 | (MgO)—(SiO₂) 15 85 | | 1.52 | 5.40 | 20.0 |
| Example 6: | | | | | |
| 4 | (CaO)—(SiO₂) 40 60 | | 2.35 | 80.0 | 2.0 |

TABLE 4-continued

| Sample No. | Composition (wt %) | Specific Gravity | Ratio A* (%) | Oxygen Permeability (cc/m² · atm · day) |
|---|---|---|---|---|
| 5 | (CaO)—(SiO₂)<br>40      60 | 2.12 | 72.0 | 3.2 |
| 6 | (CaO)—(SiO₂)<br>40      60 | 1.70 | 58.0 | 4.0 |
| Comparative Example 4-2: | | | | |
| 2 | (CaO)—(SiO₂)<br>40      60 | 1.47 | 50.0 | 80.0 |
| Example 6: | | | | |
| 7 | (Al₂O₃)—(MgO)—(SiO₂)<br>30        10        60 | 2.52 | 80.0 | 0.8 |
| 8 | (Al₂O₃)—(MgO)—(SiO₂)<br>30        10        60 | 2.28 | 72.5 | 1.2 |
| 9 | (Al₂O₃)—(MgO)—(SiO₂)<br>30        10        60 | 1.89 | 60.0 | 2.0 |
| Comparative Example 4-2: | | | | |
| 3 | (Al₂O₃)—(MgO)—(SiO₂)<br>30        10        60 | 1.70 | 54.0 | 70.0 |

*A ratio of a specific gravity of a standard oxide to that of a thin film

TABLE 5A

| Sample No. | Ratio of Emission Time | | Emission Current of EB Gun (Ampere) | Film Advance Rate (m/min.) | Vapor Pressure during Evaporation (Torr) |
|---|---|---|---|---|---|
| | Al₂O₃ | SiO₂ | | | |
| Examples 7: | | | | | |
| 1 | 30 | 10 | 2.0 | 50 | 8.5 × 10⁻⁴ |
| 2 | 40 | 10 | 2.0 | 50 | 8.8 × 10⁻⁴ |
| 3 | 50 | 10 | 2.0 | 50 | 9.2 × 10⁻⁴ |
| 4 | 60 | 10 | 2.0 | 50 | 9.4 × 10⁻⁴ |
| 5 | 70 | 10 | 2.0 | 50 | 9.6 × 10⁻⁴ |
| Example 8: | | | | | |
| — | 10 | 10 | 2.0 | 50 | 8.0 × 10⁻⁴ |

The supply amount of oxygen: 130 ccM
The temperature of a chill roller: −10° C.

TABLE 5B

| Sample No. | Specific Gravity | Ratio A* (%) | Composition | | Thickness of Thin Film (angstroms) | Oxygen Permeability | | |
|---|---|---|---|---|---|---|---|---|
| | | | Al₂O₃ (wt %) | SiO₂ (wt %) | | Before Treatment | After Retorting | After Gelbo Treatment |
| | | | | | | (cc/m² · atm · day) | | |
| Example 7: | | | | | | | | |
| 1 | 2.25 | 72.3 | 35 | 65 | 800 | 0.4 | 0.6 | 1.0 |
| 2 | 2.38 | 72.8 | 47 | 53 | 800 | 0.4 | 0.5 | 1.0 |
| 3 | 2.50 | 73.5 | 57 | 43 | 800 | 0.4 | 0.5 | 1.0 |
| 4 | 2.60 | 74.1 | 65 | 35 | 800 | 0.5 | 0.7 | 0.9 |
| 5 | 2.71 | 74.5 | 75 | 25 | 800 | 0.5 | 0.7 | 0.9 |

TABLE 5B-continued

| Sample No. | Specific Gravity | Ratio A* (%) | Composition Al₂O₃ (wt %) | Composition SiO₂ (wt %) | Thickness of Thin Film (angstroms) | Oxygen Permeability Before Treatment (cc/m² · atm · day) | Oxygen Permeability After Retorting (cc/m² · atm · day) | Oxygen Permeability After Gelbo Treatment (cc/m² · atm · day) |
|---|---|---|---|---|---|---|---|---|
| Example 8: | | | | | | | | |
| — | 2.05 | 72.0 | 15 | 85 | 800 | 1.0 | 30.0 | 1.5 |

*A ratio of a specific gravity of a standard oxide to that of a thin film.

TABLE 6A

| | Specific Gravity | Ratio A* (%) | Composition Al₂O₃ (wt %) | Composition SiO₂ (wt %) | Thickness of Thin Film (angstrom) |
|---|---|---|---|---|---|
| Ex. 10-1 | 2.55 | 87.5 | 20 | 80 | 3000 |
| Ex. 9-1 | 2.30 | 78.9 | 20 | 80 | 3000 |
| Ex. 9-2 | 2.05 | 70.4 | 20 | 80 | 1500 |
| Ex. 10-3 | 1.90 | 65.2 | 20 | 80 | 600 |
| Com. Ex. 5-1 | 1.58 | 54.2 | 20 | 80 | 600 |
| Ex. 10-2 | 2.75 | 86.5 | 40 | 60 | 4000 |
| Ex. 9-4 | 2.50 | 78.6 | 40 | 60 | 4000 |
| Ex. 9-5 | 2.30 | 72.3 | 40 | 60 | 2000 |
| Ex. 9-6 | 2.22 | 69.9 | 40 | 60 | 1000 |
| Ex. 9-7 | 2.05 | 64.5 | 40 | 60 | 400 |
| Com. Ex. 5-2 | 1.74 | 54.8 | 40 | 60 | 400 |
| Ex. 10-3 | 3.00 | 87.2 | 60 | 40 | 4000 |
| Ex. 9-8 | 2.75 | 79.9 | 60 | 40 | 4000 |
| Ex. 9-9 | 2.53 | 73.5 | 60 | 40 | 2000 |
| Ex. 9-10 | 2.40 | 69.7 | 60 | 40 | 1000 |
| Ex. 9-11 | 2.25 | 65.4 | 60 | 40 | 400 |
| Com. Ex. 5-3 | 1.88 | 54.6 | 60 | 60 | 400 |

*A ratio of a specific gravity of a standard oxide to that of a thin film

TABLE 6B

| | Oxygen Permeability (cc/m² · atm · day) | | |
|---|---|---|---|
| | Before Treatment | After Retorting | After Gelbo Treatment |
| Ex. 10-1 | 0.5 | 0.5 | over* |
| Ex. 9-1 | 0.5 | 0.5 | 3.8 |
| Ex. 9-2 | 1.0 | 1.1 | 1.2 |
| Ex. 9-3 | 1.0 | 1.5 | 1.2 |
| Com. Ex. 5-1 | 10.0 | over* | 15.0 |
| Ex. 10-2 | 0.15 | 0.2 | over* |
| Ex. 9-4 | 0.2 | 0.2 | 5.0 |
| Ex. 9-5 | 0.4 | 0.4 | 1.0 |
| Ex. 9-6 | 0.5 | 0.5 | 0.9 |
| Ex. 9-7 | 0.9 | 1.0 | 1.0 |
| Com. Ex. 5-2 | 8.0 | over* | 12.0 |
| Ex. 10-3 | 0.2 | 0.2 | over* |
| Ex. 9-8 | 0.2 | 0.2 | 2.8 |
| Ex. 9-9 | 0.4 | 0.5 | 0.8 |
| Ex. 9-10 | 0.5 | 0.5 | 0.9 |
| Ex. 9-11 | 0.7 | 0.8 | 0.9 |
| Com. Ex. 5-3 | 8.0 | over* | 11.0 |

*The oxygen permeability was about 200 cc/m² · atm · day and could not be determined precisely.

TABLE 6C

| | Specific Gravity | Ratio A* (%) | Composition Al₂O₃ (wt %) | Composition SiO₂ (wt %) | Thickness of Thin Film (angstrom) |
|---|---|---|---|---|---|
| Ex. 10-4 | 3.24 | 87.4 | 80 | 20 | 4000 |
| Ex. 9-12 | 2.95 | 79.6 | 80 | 20 | 4000 |
| Ex. 9-13 | 2.75 | 74.2 | 80 | 20 | 2000 |
| Ex. 9-14 | 2.60 | 70.2 | 80 | 20 | 1000 |
| Ex. 9-15 | 2.45 | 66.1 | 80 | 20 | 400 |
| Com. Ex. 5-4 | 2.00 | 54.0 | 80 | 20 | 400 |
| Ex. 10-5 | 3.38 | 86.6 | 95 | 5 | 3000 |
| Ex. 9-16 | 3.05 | 78.1 | 95 | 5 | 3000 |
| Ex. 9-17 | 2.80 | 71.7 | 95 | 5 | 1500 |
| Ex. 9-18 | 2.65 | 87.9 | 95 | 5 | 600 |
| Com. Ex. 5-5 | 2.13 | 54.6 | 95 | 5 | 600 |

*A ratio of a specific gravity of a standard oxide to that of a thin film

TABLE 6D

| | Oxygen Permeability (cc/m² · atm · day) | | |
|---|---|---|---|
| | Before Treatment | After Retorting | After Gelbo Treatment |
| Ex. 10-4 | 0.2 | 0.3 | over* |
| Ex. 9-12 | 0.2 | 0.2 | 2.6 |
| Ex. 9-13 | 0.4 | 0.5 | 1.0 |
| Ex. 9-14 | 0.5 | 0.6 | 0.9 |
| Ex. 9-15 | 0.7 | 1.0 | 1.0 |
| Com. Ex. 5-4 | 8.0 | over* | 12.0 |
| Ex. 10-5 | 0.3 | 0.3 | over* |
| Ex. 9-16 | 0.3 | 0.5 | 1.2 |
| Ex. 9-17 | 0.6 | 0.8 | 0.9 |
| Ex. 9-18 | 1.0 | 1.5 | 1.1 |
| Com. Ex. 5-5 | 10.0 | over* | 15.0 |

*The oxygen permeability was about 200 cc/m² · atm · day and could not be determined precisely.

TABLE 7

| Sample No. | Specific Gravity | Ratio A* | Composition MgO (wt %) | Composition SiO$_2$ (wt %) | Thickness of Thin Film (angstroms) | Oxygen Permeability Before Gelbo Treatment (cc/m$^2$ · atm · day) | Oxygen Permeability After Gelbo Treatment (cc/m$^2$ · atm · day) | Vapor Permeability Before Gelbo Treatment (g/m$^2$ · atm · day) | Vapor Permeability After Gelbo Treatment (g/m$^2$ · atm · day) |
|---|---|---|---|---|---|---|---|---|---|
| Example 11: | | | | | | | | | |
| 1 | 1.68 | 62.2 | 5 | 95 | 400 | 1.5 | 2.0 | 0.6 | 1.0 |
| 2 | 1.88 | 66.0 | 20 | 80 | 400 | 0.7 | 1.1 | 0.7 | 1.4 |
| 3 | 2.12 | 69.5 | 40 | 60 | 400 | 0.8 | 1.5 | 1.0 | 1.5 |
| 4 | 2.55 | 78.5 | 60 | 40 | 400 | 1.2 | 1.5 | 1.0 | 1.5 |
| 5 | 2.90 | 84.0 | 80 | 20 | 400 | 2.5 | 3.8 | 0.8 | 1.8 |
| Example 12: | | | | | | | | | |
| — | 3.26 | 90.5 | 95 | 5 | 400 | 2.5 | 3.9 | 2.0 | 2.5 |

*A ratio of a specific gravity of a standard oxide to that of a thin film.

TABLE 8A

| Sample No. | Specific Gravity | Ratio A* | Composition MgO (wt %) | Composition SiO$_2$ (wt %) | Thickness of Thin Film (angstrom) | Oxygen Permeability Before Gelbo Treatment (cc/m$^2$ · atm · day) | Oxygen Permeability After Gelbo Treatment (cc/m$^2$ · atm · day) | Vapor Permeability Before Gelbo Treatment (g/m$^2$ · atm · day) | Vapor Permeability After Gelbo Treatment (g/m$^2$ · atm · day) |
|---|---|---|---|---|---|---|---|---|---|
| Ex. 14: | | | | | | | | | |
| 1 | 2.40 | 88.9 | 5 | 95 | 3000 | 0.15 | over** | 0.3 | 40.0 |
| Ex. 13: | | | | | | | | | |
| 1 | 2.30 | 85.0 | 5 | 95 | 3000 | 0.2 | 3.0 | 0.2 | 1.2 |
| Ex. 13: | | | | | | | | | |
| 2 | 2.00 | 74.0 | 5 | 95 | 1000 | 0.4 | 2.0 | 0.4 | 0.9 |
| Ex. 13: | | | | | | | | | |
| 3 | 1.70 | 65.0 | 5 | 95 | 400 | 1.5 | 2.0 | 0.6 | 1.0 |
| Com. Ex. 6: | | | | | | | | | |
| 1 | 1.48 | 54.9 | 5 | 95 | 400 | 8.0 | 12.0 | 10.0 | 20.0 |
| Ex. 14: | | | | | | | | | |
| 2 | 2.65 | 93.0 | 20 | 80 | 3000 | 0.15 | over** | 0.8 | 40.0 |
| Ex. 13: | | | | | | | | | |
| 4 | 2.48 | 87.0 | 20 | 80 | 3000 | 0.2 | 2.8 | 0.3 | 1.5 |
| Ex. 13: | | | | | | | | | |
| 5 | 2.20 | 77.2 | 20 | 80 | 1500 | 0.4 | 1.0 | 0.5 | 1.1 |
| Ex. 13: | | | | | | | | | |
| 6 | 2.05 | 71.9 | 20 | 80 | 800 | 0.5 | 0.9 | 0.5 | 0.9 |
| Ex. 13: | | | | | | | | | |
| 7 | 1.85 | 64.9 | 20 | 80 | 300 | 0.8 | 1.2 | 0.8 | 1.5 |
| Com. Ex. 6: | | | | | | | | | |
| 2 | 1.56 | 54.8 | 20 | 80 | 300 | 8.0 | 12.0 | 10.0 | 20.0 |
| Ex. 14: | | | | | | | | | |
| 3 | 2.80 | 91.8 | 40 | 60 | 3000 | 0.2 | over** | 0.2 | 40.0 |
| Ex. 13: | | | | | | | | | |
| 8 | 2.65 | 86.9 | 40 | 60 | 3000 | 0.2 | 2.8 | 0.2 | 1.6 |
| Ex. 13: | | | | | | | | | |
| 9 | 2.45 | 80.3 | 40 | 60 | 1500 | 0.4 | 1.0 | 0.5 | 1.0 |
| Ex. 13: | | | | | | | | | |
| 10 | 2.30 | 75.4 | 40 | 60 | 800 | 0.5 | 1.0 | 0.4 | 1.0 |
| Ex. 13: | | | | | | | | | |
| 11 | 2.10 | 68.9 | 40 | 60 | 300 | 0.7 | 1.1 | 1.0 | 1.5 |

TABLE 8A-continued

| Sample No. | Specific Gravity | Ratio A* | Composition MgO (wt %) | Composition SiO$_2$ (wt %) | Thickness of Thin Film (angstrom) | Oxygen Permeability Before Gelbo Treatment (cc/m$^2$ · atm · day) | Oxygen Permeability After Gelbo Treatment (cc/m$^2$ · atm · day) | Vapor Permeability Before Gelbo Treatment (g/m$^2$ · atm · day) | Vapor Permeability After Gelbo Treatment (g/m$^2$ · atm · day) |
|---|---|---|---|---|---|---|---|---|---|
| Com. Ex. 6: | | | | | | | | | |
| 3 | 1.67 | 54.8 | 40 | 60 | 300 | 8.0 | 12.0 | 10.0 | 20.0 |

*A ratio of a specific gravity of a standard oxide to that of a thin film
**The oxygen permeability was about 200 cc/m$^2$ · atm · day and could not be determined precisely.

TABLE 8B

| Sample No. | Specific Gravity | Ratio A* | Composition MgO (wt %) | Composition SiO$_2$ (wt %) | Thickness of Thin Film (angstrom) | Oxygen Permeability Before Gelbo Treatment (cc/m$^2$ · atm · day) | Oxygen Permeability After Gelbo Treatment (cc/m$^2$ · atm · day) | Vapor Permeability Before Gelbo Treatment (g/m$^2$ · atm · day) | Vapor Permeability After Gelbo Treatment (g/m$^2$ · atm · day) |
|---|---|---|---|---|---|---|---|---|---|
| Ex. 14: | | | | | | | | | |
| 4 | 3.08 | 94.8 | 60 | 40 | 3000 | 0.15 | over** | 0.3 | 40.0 |
| Ex. 13: | | | | | | | | | |
| 12 | 2.80 | 86.2 | 60 | 40 | 3000 | 0.2 | 3.0 | 0.2 | 1.2 |
| Ex. 13: | | | | | | | | | |
| 13 | 2.65 | 81.5 | 60 | 40 | 1500 | 0.3 | 1.1 | 0.4 | 1.0 |
| Ex. 13: | | | | | | | | | |
| 14 | 2.50 | 76.9 | 60 | 40 | 800 | 0.5 | 1.3 | 0.6 | 1.0 |
| Ex. 13: | | | | | | | | | |
| 15 | 2;32 | 71.4 | 60 | 40 | 300 | 1.5 | 2.0 | 1.0 | 1.5 |
| Com. Ex. 6: | | | | | | | | | |
| 4 | 1.77 | 54.5 | 60 | 40 | 300 | 10.0 | 15.0 | 15.0 | 25.0 |
| Ex. 14: | | | | | | | | | |
| 5 | 3.20 | 92.8 | 80 | 20 | 3000 | 0.15 | over** | 0.2 | 40.0 |
| Ex. 13: | | | | | | | | | |
| 16 | 3.15 | 88.4 | 80 | 20 | 3000 | 0.2 | 2.8 | 0.3 | 2.0 |
| Ex. 13: | | | | | | | | | |
| 17 | 2.90 | 84.1 | 80 | 20 | 1000 | 0.4 | 1.0 | 0.5 | 1.0 |
| Ex. 13: | | | | | | | | | |
| 18 | 2.52 | 73.0 | 80 | 20 | 400 | 2.5 | 4.0 | 0.6 | 2.0 |
| Com. Ex. 6: | | | | | | | | | |
| 5 | 1.88 | 54.5 | 80 | 20 | 400 | 15.0 | 20.0 | 40.0 | 40.0 |

*A ratio of a specific gravity of a standard oxide to that of a thin film
**The oxygen permeability was about 200 cc/m$^2$ · atm · day and could not be determined precisely.

What is claimed is:

1. A gas barrier film comprising a plastic film and a thin film formed on at least one surface of said plastic film, said thin film comprising an oxide, said oxide is selected from the group consisting of aluminum oxide and silicon oxide, wherein the specific gravity of said thin film is 2.70 to 3.30 when said oxide is aluminum oxide, and the specific gravity of said thin film is 1.80 to 2.20 when said oxide is silicon oxide.

2. A gas barrier film according to claim 1, wherein the oxide is aluminum oxide and the specific gravity of the thin film is 2.70 to 3.30.

3. A gas barrier film according to claim 1, wherein the oxide is silicon oxide and the specific gravity of the thin film is 1.80 to 2.20.

4. A multilayered gas barrier film comprising a gas barrier film of claim 1 and a heat seal layer formed on the gas barrier film.

5. A wrapping material comprising a gas barrier film which comprises a plastic film and a thin film formed on at least one surface of said plastic film, said thin film comprising an oxide, said oxide is selected from the group consisting of aluminum oxide and a silicon oxide, wherein the specific gravity of said thin film is 2.70 to 3.30 when said oxide is aluminum oxide, and the specific gravity of said thin film is 1.80 to 2.20 when said oxide is silicon oxide.

6. A wrapping material comprising a multilayered gas barrier film comprising a gas barrier film and a heat seal layer formed on the gas barrier film, wherein said gas barrier film comprises a plastic film and a thin film formed on at least one surface of said plastic film, said thin film comprising an oxide, said oxide is selected from the group consisting of aluminum oxide and silicon oxide, wherein the specific gravity of said thin film is 2.70 to 3.30 when said oxide is aluminum oxide, and the specific gravity of said thin film is 1.80 to 2.20 when said oxide is silicon oxide.

* * * * *

UNITED STATES PATENT AND TRADEMARK OFFICE
CERTIFICATE OF CORRECTION

PATENT NO. : 5,856,017
DATED : January 5, 1999
INVENTOR(S) : Matsuda et al.

It is certified that error appears in the above-identified patent and that said Letters Patent is hereby corrected as shown below:

On the title page, item:

[62] Related U.S. Application Data Line 2: "977,341" should read --997,341--.

In column 1, line 3: "977,341" should read --997,341--.

In column 11, line 42: delete "Ad".

In column 16, line 49: "BA" should read --8A--.

In column 23, line 36 (Table 6A): The second occurrence of "60" should read --40--.

In column 23, line 51 (Table 6B): "5.0" should read --3.0--.

In column 24, line 36 (Table 6C): "87.9" should read --67.9--.

In column 24, line 56 (Table 6D): "0.5" should read --0.3--.

In column 26, second line from the bottom of Table 8A: "0.4" should read --0.6--.

In column 27, line 35 (Table 8B): "2;32" should read --2.32--.

Signed and Sealed this

Thirteenth Day of July, 1999

Attest:

*Attesting Officer*

Q. TODD DICKINSON

*Acting Commissioner of Patents and Trademarks*